(12) United States Patent
Chong et al.

(10) Patent No.: US 8,988,954 B2
(45) Date of Patent: Mar. 24, 2015

(54) MEMORY DEVICE AND METHOD OF PERFORMING A READ OPERATION WITHIN SUCH A MEMORY DEVICE

(75) Inventors: Yew K Chong, New Braunfels, TX (US); Sanjay Mangal, Austin, TX (US)

(73) Assignee: ARM Limited, Cambridge (GB)

( * ) Notice: Subject to any disclaimer, the term of this patent is extended or adjusted under 35 U.S.C. 154(b) by 315 days.

(21) Appl. No.: 13/612,953

(22) Filed: Sep. 13, 2012

(65) Prior Publication Data

US 2014/0071776 A1    Mar. 13, 2014

(51) Int. Cl.
| | |
|---|---|
| G11C 7/00 | (2006.01) |
| G11C 7/12 | (2006.01) |
| G11C 7/06 | (2006.01) |
| G11C 7/10 | (2006.01) |
| G11C 11/409 | (2006.01) |
| G11C 5/02 | (2006.01) |
| G11C 7/02 | (2006.01) |
| G11C 7/22 | (2006.01) |
| G11C 11/419 | (2006.01) |

(52) U.S. Cl.
CPC .. *G11C 7/12* (2013.01); *G11C 7/06* (2013.01); *G11C 7/10* (2013.01); *G11C 11/409* (2013.01); *G11C 5/025* (2013.01); *G11C 7/02* (2013.01); *G11C 7/1048* (2013.01); *G11C 7/222* (2013.01); *G11C 11/419* (2013.01)
USPC .... 365/194; 365/191; 365/203; 365/189.011; 365/189.11

(58) Field of Classification Search
CPC .......... G11C 7/12; G11C 7/10; G11C 11/409; G11C 11/419
USPC .............. 365/194, 191, 203, 189.011, 189.11
See application file for complete search history.

(56) References Cited

U.S. PATENT DOCUMENTS

| | | | |
|---|---|---|---|
| 6,690,604 B2 | 2/2004 | Hsu et al. | |
| 7,085,184 B1 | 8/2006 | Walther et al. | |
| 2005/0068827 A1 | 3/2005 | Wijeratne et al. | |
| 2008/0151653 A1* | 6/2008 | Ishikura et al. .......... | 365/189.15 |
| 2008/0310246 A1 | 12/2008 | Joshi et al. | |
| 2009/0251974 A1 | 10/2009 | Chu et al. | |
| 2010/0157705 A1 | 6/2010 | Geuskens et al. | |
| 2010/0254199 A1* | 10/2010 | Houston .................. | 365/189.05 |
| 2011/0273945 A1 | 11/2011 | Donkoh | |
| 2012/0099383 A1* | 4/2012 | Kim et al. ................ | 365/189.02 |
| 2013/0182519 A1* | 7/2013 | Chen et al. .................... | 365/203 |

OTHER PUBLICATIONS

GB Search Report dated Mar. 25, 2014 in GB 1320121.5.

* cited by examiner

*Primary Examiner* — Toan Le
(74) *Attorney, Agent, or Firm* — Nixon & Vanderhye P.C.

(57) ABSTRACT

A memory device is provided comprising an array of memory cells. During a read operation, voltage on a read bit line will transition towards a second voltage level if a data value stored in that activated memory cell has a first value, and sense amplifier circuitry will then detect this situation. If that situation is not detected, the sense amplifier circuitry determines that the activated memory cell stores a second value. Bit line keeper circuitry is coupled to each read bit line and is responsive to an asserted keeper pulse signal to pull the voltage on each read bit line towards the first voltage level. Keeper pulse signal generation circuitry asserts the keeper pulse signal at a selected time. The selected time is such that the voltage on the associated read bit line will have transitioned to the trip voltage level before the keeper pulse signal is asserted.

19 Claims, 9 Drawing Sheets

MEMORY DEVICE AND METHOD OF PERFORMING A READ OPERATION WITHIN SUCH A MEMORY DEVICE

BACKGROUND OF THE INVENTION

1. Field of the Invention

The present invention relates to a memory device comprising an array of memory cells, and to a method of performing a read operation within such a memory device.

2. Description of the Prior Art

As process geometries shrink in modern data processing systems, the variability in the operating characteristics of the individual circuit elements increases. Considering as an example a memory device consisting of an array of memory cells, it will be understood that each memory cell will typically consist of a number of electronic components such as transistors, and the variability in those individual components significantly increases as process geometries shrink. Furthermore, there is an increasing desire to operate data processing systems at lower and lower supply voltages, but as the supply voltage decreases, reliability issues due to the variations in the individual components become more prominent.

One reliability concern arises from the fact that leakage current can increase within the individual memory cells as the process geometries shrink, and this can potentially give rise to incorrect operation. Considering as an example a single-ended memory cell, such a memory cell uses a single read bit line coupled to an internal node of the memory cell to allow the data value stored in that memory cell to be read during a read operation. The single read bit line is precharged to a first voltage level (typically the supply voltage Vdd) and then if a memory cell coupled to that read bit line is addressed during a read operation (by an asserted read word line signal on the read word line to which that memory cell is coupled), the voltage on the bit line will either stay at the first voltage level, or will discharge towards the second voltage level, depending on the value stored within the memory cell. During the period that the read word line signal is asserted, a sense amplifier connected to the read bit line monitors the voltage on the read bit line, and if the voltage transitions to a trip voltage level between the first and second voltage levels whilst the read word line signal is asserted, the sense amplifier will determine that the memory cell stores a first value, whilst if it does not transition to the trip voltage level the sense amplifier will determine that the memory cell stores a second value.

However, any particular read bit line will typically have multiple memory cells within a particular column of the array coupled to it, with only one of those memory cells being addressed during a particular read operation. During the read operation, there will be some leakage current due to those memory cells coupled to the read bit line, with the amount of leakage current depending on a number of factors, for example the data values stored within those memory cells. As the process geometries shrink, the leakage current tends to increase, and in some instances the leakage current can be significant enough that even though the addressed memory cell stores the second value, and accordingly the voltage on the read bit line should be retained at the first voltage level, the voltage on the read bit line starts to transition towards the second voltage level due to the leakage current, and may in fact reach the trip voltage level whilst the read word line is still asserted. In that instance, the sense amplifier will incorrectly determine that the addressed memory cell stores the first value (even though it in fact stores the second value).

One known approach to guard against this possibility is to provide bit line keeper circuitry that is connected to the read bit line, and which serves to weakly pull the bit line towards the first voltage level during the read operation. If the addressed memory cell does store the first value, it will overcome the weak pull of the bit line keeper circuitry, and accordingly the voltage will transition to the trip voltage level during the read operation. However, the leakage current effects will not be strong enough to overcome the weak pull of the bit line keeper, accordingly avoiding a potential incorrect sensing of the data value by the sense amplifier circuitry. However, whilst the addressed memory cell can overcome the weak pull of the bit line keeper circuitry if it does store the first value, the weak pull of the bit line keeper circuitry nevertheless impacts the speed with which the voltage on the read bit line transitions from the first voltage level towards the second voltage level, and accordingly impacts the performance of the read operation.

To avoid this impact on read performance, it would be necessary to make the memory cells significantly larger in order to enable them to more quickly overcome the effect of the bit line keeper circuitry. However, if the memory cells are made larger, this increases the area and power consumption of the memory device, which is undesirable.

Accordingly, it would be desirable to provide an improved technique for performing a read operation within a memory device.

SUMMARY OF THE INVENTION

Viewed from a first aspect, the present invention provides a memory device comprising: an array of memory cells arranged as a plurality of rows and columns, each row of memory cells being coupled to an associated read word line, each column of memory cells forming at least one column group, and the memory cells of each column group being coupled to an associated read bit line; word line driver circuitry configured, during a read operation, to issue an asserted read word line pulse signal on the read word line coupled to an addressed row of the array so as to activate the memory cells within that addressed row whilst the read word line pulse signal is asserted; precharge circuitry configured, prior to the read operation, to precharge each read bit line to a first voltage level; during the read operation the voltage on the read bit line associated with any column group containing one of the activated memory cells being arranged to transition towards a second voltage level if a data value stored in that activated memory cell has a first value; sense amplifier circuitry connected to the associated read bit line of each column group, and configured for each activated memory cell to determine that that activated memory cell stores said first value if the voltage on the associated read bit line transitions to a trip voltage level between said first and said second voltage levels whilst the read word line pulse signal is asserted, and to determine that that activated memory cell stores a second value if the voltage on the associated read bit line does not transition to said trip voltage level whilst the read word line pulse signal is asserted; bit line keeper circuitry coupled to each read bit line and responsive to an asserted keeper pulse signal to pull the voltage on each read bit line towards the first voltage level; and keeper pulse signal generation circuitry configured to assert the keeper pulse signal at a selected time after the read word line pulse signal is asserted, the selected time being selected such that if an activated memory cell stores said first value, the voltage on the associated read bit line will have transitioned to the trip voltage level before the keeper pulse signal is asserted, and such that if an activated memory cell stores said second value, leakage current within the memory cells of the column group coupled to the associated read bit line will not have caused the voltage on the associated read bit line to have transitioned to the trip voltage level before the keeper pulse signal is asserted.

In accordance with the present invention, bit line keeper circuitry is coupled to each read bit line, which, when active, pulls the voltage on each read bit line towards the first voltage level. However, instead of the bit line keeper circuitry being active throughout the read operation, the bit line keeper circuitry is instead arranged to be responsive to an asserted keeper pulse signal so that the bit line keeper circuitry is only active whilst that keeper pulse signal is asserted. In addition, keeper pulse signal generation circuitry is configured to assert the keeper pulse signal at a selected time after the read word line pulse signal is asserted, that selected time being selected such that if an activated memory cell stores the first value, the voltage on the associated read bit line will have transitioned to the trip voltage level before the keeper pulse signal is asserted. As a result, the operation of the bit line keeper circuitry does not affect the performance of the read operation, since if the first value is stored in the memory level, this will have been detected by the sense amplifier circuitry before the bit line keeper circuitry is turned on.

In addition, the selected time is selected such that if an activated memory cell stores the second value, there will be insufficient time during the read operation for the leakage current within the memory cells of the column group coupled to the associated read bit line to cause the voltage on the associated read bit line to transition to the trip voltage level before the keeper pulse signal is asserted, and hence the bit line keeper circuitry is turned on. As soon as the bit line keeper circuitry is turned on, it will pull the voltage back towards the first voltage level, and hence reverse any drop in the voltage level due to leakage current.

Such an approach hence ensures correct operation even in the presence of increased leakage current as the process geometries shrink, whilst not adversely impacting the performance of the read operation.

There are a number of ways in which the keeper pulse signal can be asserted at a selected time after the read word line pulse signal is asserted. However, in one embodiment, the memory device further comprises delay circuitry configured, in response to the word line driver circuitry asserting the read word line pulse signal, to generate a trigger signal to the keeper pulse signal generation circuitry after a selected delay period, the keeper pulse signal generation circuitry being responsive to the trigger signal to assert the keeper pulse signal.

In one embodiment, the selected delay period is programmable so as to allow the delay between the read word line pulse signal being asserted to begin the read operation, and the keeper pulse signal being asserted to turn the bit line keeper circuitry on, to be tuned having regard to a particular configuration of the memory device, particular operating conditions, etc.

One way of generating a design for a memory device is to use a memory compiler program to generate an instance of a memory device from a memory architecture. The memory architecture specifies a definition of circuit elements and data defining rules for combining those circuit elements. Particular requirements for the memory device are entered into the memory compiler, for example the size of the memory required, and then the memory compiler generates an instance of the memory device based on those requirements. In one embodiment, the selected delay period is programmable at memory compiler time to take account of the configuration of the memory cells within the array. As an example, the number of memory cells within a column connected to a particular read bit line will affect the leakage current observed by that bit line. Once the number of memory cells connected to the bit line for the particular instance created by the memory compiler is known, then that could be factored into the selection of a suitable delay period before the keeper pulse signal is asserted. In addition, or alternatively, the number of memory cells connected to a particular row in the array can also be taken into account, since as the number of memory cells in a row increases, this will affect the loading on the read word line, and hence the speed of transition of the read word line signal from a non-asserted to an asserted state. This can hence also be taken in account when determining a suitable delay period.

However, the programmability is not restricted only to tuning of the delay period at the time the particular instance of the memory device is created. Instead, or in addition, the selected delay period may be programmable such that it can be altered during operation of the memory device to take account of one or more changes in operating parameters of the memory device. An example of one such operating parameter is the operating voltage. In particular, it is becoming more common to use dynamic voltage scaling techniques during operation of a data processing system to manage power and/or energy consumption of the device. During periods of relatively low activity, the circuitry can be operated from a lower supply voltage, and then during periods of higher activity the supply voltage can be increased to provide enhanced performance. In one embodiment, different delay periods can be programmed for the various different operating voltages, so that the value of the delay period can be switched when the operating mode of the processor changes from one using a first supply voltage level to one using a second supply voltage level. Alternatively, rather than using a set of discrete preset delay periods, the delay period may be varied dynamically as the operating parameters (such as voltage, temperature, etc) vary during operation of the memory device.

In one embodiment, the keeper pulse signal generation circuitry is responsive to de-assertion of the read word line pulse signal to de-assert the keeper pulse signal. Hence, it can be seen in such embodiments that the keeper pulse signal is asserted at some predetermined period after the read word line pulse signal is asserted, and is then de-asserted in response to de-assertion of the read word line pulse signal. In one particular embodiment, it has been found that the keeper pulse signal only needs to be asserted for a relatively short period of time towards the end of the read word line pulse signal, in one particular embodiment the keeper pulse signal only being asserted once approximately 70% of the duration of the read word line pulse signal has elapsed.

The bit line keeper circuitry can be constructed in a variety of ways. However, in one embodiment the bit line keeper circuitry comprises, for each read bit line, a plurality of transistors connected in series between that read bit line and a terminal at the first voltage level, a gate terminal of at least one of said transistors being driven by the keeper pulse signal. By arranging a plurality of transistors in series, this reduces the strength of the bit line keeper circuitry and ensures that it only weakly pulls the voltage on the read bit line towards the first voltage level.

In one particular embodiment, the plurality of transistors are PMOS transistors, and said keeper pulse signal is asserted at a logic zero level and de-asserted at a logic one level.

In one embodiment, the bit line keeper circuitry further comprises, for each read bit line, an inverter connected between that read bit line and a gate terminal of at least one of said transistors. By the use of such an inverter, it can be seen that if the addressed memory cell does store the first value, and hence the voltage on the read bit line is discharged to the trip voltage level during the read operation, this action will cause the transistor connected to the output of the inverter to be turned off during the course of the read operation, so that by the time the keeper pulse signal is asserted, the bit line keeper circuitry will remain effectively turned off, hence reducing power consumption in that situation. This is useful, since that situation is the situation where the bit line keeper circuitry is not actually required, and hence by turning it off in that situation it is possible to reduce overall power consumption without any effect on correct operation.

In one particular embodiment, a first transistor and a last transistor in said plurality have their gate terminals driven by the keeper pulse signal and at least one transistor between the first transistor and the last transistor has its gate terminal connected to an output of the inverter.

In one embodiment, each memory cell comprises coupling circuitry connected between the associated read bit line and a terminal at said second voltage level, during a read operation the coupling circuitry of the memory cells within each column group contributing towards a leakage current that draws the voltage level on the associated read bit line towards said second voltage level.

The coupling circuitry can take a variety of forms, but in one embodiment the coupling circuitry of each memory cell comprises a plurality of coupling transistors arranged in series between the associated read bit line and said terminal at said second voltage level, a gate terminal of at least one of the coupling transistors being connected to the read word line pulse signal and a gate terminal of at least one other of the coupling transistors being connected to an internal storage node of the memory cell. In one particular embodiment, the coupling transistors are NMOS transistors. During a read operation, in addition to the addressed memory cell within a column, all of the other memory cells within a column group will be coupled to the read bit line via their associated coupling transistors. Even though the coupling transistors of those memory cells that have their gate connected to the read word line will not be turned on (since they are not the addressed memory cells), the coupling transistors whose gates are connected to the internal storage node of the memory cell may or may not be turned on, dependent on the data value held within those cells. For the memory cells storing data values causing those coupling transistors to turn on, a significant leakage current can be drawn through the series of coupling transistors of those memory cells. To a lesser degree, leakage current can also be observed if a non-addressed memory cell stores a value that does not cause any of its coupling transistors to turn on, or if an addressed memory cell stores a data value that does not turn on the coupling transistor whose gate is connected to the internal storage node (i.e. a situation where the read bit line should not be drawn towards the second voltage level). It will hence be seen that there are a variety of sources of leakage current within the memory cells of each column group.

The first and second voltage levels will vary dependent on implementation. However, in one embodiment the first voltage level is a supply voltage level and the second voltage level is a ground voltage level.

Whilst in one embodiment each column of memory cells may include only a single column group, in an alternative embodiment each column of memory cells forms a plurality of column groups.

In embodiments where there are a plurality of column groups within each column, then the column groups can be configured in a variety of ways. In one embodiment, each column group may have its own associated sense amplifier circuitry. However, in an alternative embodiment, the plurality of column groups form multiple pairs of column groups, and the sense amplifier circuitry comprises a sense amplifier element associated with each pair of column groups, the sense amplifier element being connected to the read bit lines of both column groups in the associated pair. In one particular embodiment, the sense amplifier element comprises a NAND gate structure.

Viewed from a second aspect, the present invention provides a method of performing a read operation within a memory device having an array of memory cells arranged as a plurality of rows and columns, each row of memory cells being coupled to an associated read word line, each column of memory cells forming at least one column group, and the memory cells of each column group being coupled to an associated read bit line, the method comprising: prior to the read operation, precharging each read bit line to a first voltage level; during the read operation, issuing an asserted read word line pulse signal on the read word line coupled to an addressed row of the array so as to activate the memory cells within that addressed row whilst the read word line pulse signal is asserted, during the read operation the voltage on the read bit line associated with any column group containing one of the activated memory cells being arranged to transition towards a second voltage level if a data value stored in that activated memory cell has a first value; using sense amplifier circuitry connected to the associated read bit line of each column group to determine, for each activated memory cell, that that activated memory cell stores said first value if the voltage on the associated read bit line transitions to a trip voltage level between said first and said second voltage levels whilst the read word line pulse signal is asserted, and to determine that that activated memory cell stores a second value if the voltage on the associated read bit line does not transition to said trip voltage level whilst the read word line pulse signal is asserted; responsive to an asserted keeper pulse signal, using bit line keeper circuitry coupled to each read bit line to pull the voltage on each read bit line towards the first voltage level; and asserting the keeper pulse signal at a selected time after the read word line pulse signal is asserted, the selected time being selected such that if an activated memory cell stores said first value, the voltage on the associated read bit line will have transitioned to the trip voltage level before the keeper pulse signal is asserted, and such that if an activated memory cell stores said second value, leakage current within the memory cells of the column group coupled to the associated read bit line will not have caused the voltage on the associated read bit line to have transitioned to the trip voltage level before the keeper pulse signal is asserted.

Viewed from a third aspect, the present invention provides a memory device comprising: an array of memory cell means arranged as a plurality of rows and columns, each row of memory cell means for coupling to an associated read word line, each column of memory cell means for forming at least one column group, and the memory cell means of each column group for coupling to an associated read bit line; word line driver means for issuing, during a read operation, an asserted read word line pulse signal on the read word line coupled to an addressed row of the array so as to activate the memory cell means within that addressed row whilst the read word line pulse signal is asserted; precharge means for precharging, prior to the read operation, each read bit line to a first voltage level; during the read operation the voltage on the read bit line associated with any column group containing one of the activated memory cell means being arranged to transition towards a second voltage level if a data value stored in that activated memory cell means has a first value; sense amplifier means for connecting to the associated read bit line of each column group, and for determining, for each activated memory cell means, that that activated memory cell means stores said first value if the voltage on the associated read bit line transitions to a trip voltage level between said first and said second voltage levels whilst the read word line pulse signal is asserted, and for determining that that activated memory cell means stores a second value if the voltage on the associated read bit line does not transition to said trip voltage level whilst the read word line pulse signal is asserted; bit line keeper means for coupling to each read bit line and, responsive to an asserted keeper pulse signal, for pulling the voltage on each read bit line towards the first voltage level; and keeper pulse signal generation means for asserting the keeper pulse signal at a selected time after the read word line pulse signal is asserted, the selected time being selected such that if an activated memory cell means stores said first value, the voltage on the associated read bit line will have transitioned to the trip voltage level before the keeper pulse signal is asserted, and such that if an activated memory cell means stores said second value, leakage current within the memory cell means of the column group coupled to the associated read bit line will not have caused the voltage on the associated read bit line to have transitioned to the trip voltage level before the keeper pulse signal is asserted.

Viewed from a fourth aspect, the present invention provides a computer program storage medium (for example a non-transitory storage medium) storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device in accordance with the first aspect of the present invention.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1A:
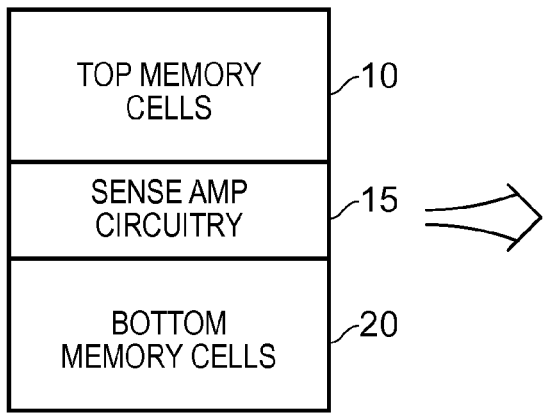
FIGS. 1A and 1B illustrate two alternative configuration of memory block structures that can be used to form a memory array of a memory device in accordance with embodiments.
Figure 1A:
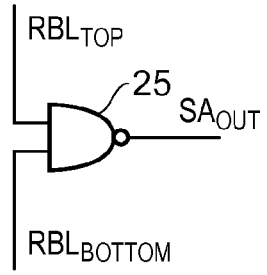
Figure 1B:
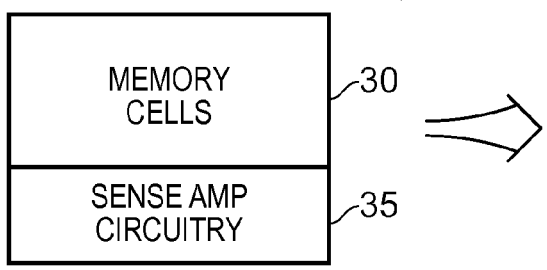
Figure 1B:
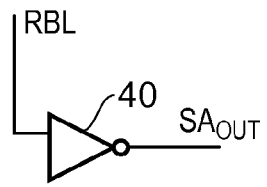

A memory device in accordance with one embodiment comprises an array of memory cells arranged as a plurality of rows and columns, each row of memory cells being coupled to an associated read word line, and each column of memory cells forming at least one column group, with the memory cells of each column group being coupled to an associated read bit line. The memory array may be constructed using block structures such as shown in FIGS. 1A and 1B. Whilst in one embodiment the memory array may comprise a single block structure, in an alternative embodiment multiple block structures may be used to form the memory array.

Considering the block structure of FIG. 1A, two memory cell groups are defined, namely a top memory cell group 10 and a bottom memory cell group 20, both of these memory cell groups sharing the same sense amplifier circuitry 15. The top and bottom memory cell groups may provide multiple columns of cells, but each column within a particular memory cell group will form the earlier mentioned column group. Accordingly, in this embodiment each column of memory cells within the top memory cell group 10 will be connected to an associated read bit line, and each column of memory cells within the bottom memory cell group 20 will also be connected to an associated read bit line. The read bit lines connected to columns of the top memory cell group will be referred to as top read bit lines ($RBL_{TOP}$) whilst the read bit lines associated with columns of the bottom memory cell group 20 will be referred to as bottom read bit lines ($RBL_{BOTTOM}$).

In accordance with the design of FIG. 1A, for each top read bit line and corresponding bottom read bit line, the sense amplifier circuitry will provide a NAND gate structure 25 to produce a consolidated sense amplifier output for that pair of read bit lines. Prior to a read operation, both bit lines will be precharged to a logic one value. During the read operation, a read word line pulse signal will be asserted to activate the memory cells within an addressed row of the array, and accordingly considering a particular pair of top and bottom read bit lines, at most only one of the memory cells connected to those pair of bit lines will be activated. During the read operation, that activated memory cell will discharge the voltage on its associated read bit line towards the logic zero voltage level (typically a ground voltage level) if a data value stored in that activated memory cell has a first value. If instead the data value is at a second value, no such discharging will be performed. Due to the operation of the NAND gate structure, it will be appreciated that the sense amp output signal will remain at a logic zero value if neither of the pair of read bit lines is discharged, but will flip to a logic one value if either one of the read bit lines is discharged towards a logic zero level. Hence, when the activated memory cell stores the first value, the sense amplifier output should flip from a logic zero value to a logic one value during the period whilst the read word line pulse signal is asserted, but if the activated memory cell stores the second value the sense amplifier output should not flip, and instead should remain at the logic zero level.

FIG. 1B illustrates an alternative block structure, where each group of memory cells 30 has its own associated sense amplifier circuitry 35. In this example, the sense amplifier circuitry can be constructed using an inverter 40, and again the sense amplifier output observes the same property as described earlier with reference to FIG. 1A. In particular, if an addressed memory cell in a column stores the first value, the bit line should discharge towards a logic zero level, causing the sense amplifier output to flip to a logic one value during the period whilst the read word line pulse signal is asserted. If instead the addressed memory cell stores the second value, no flip in the output of the sense amplifier should occur, and instead it should remain at a logic zero level.

Figure 2:
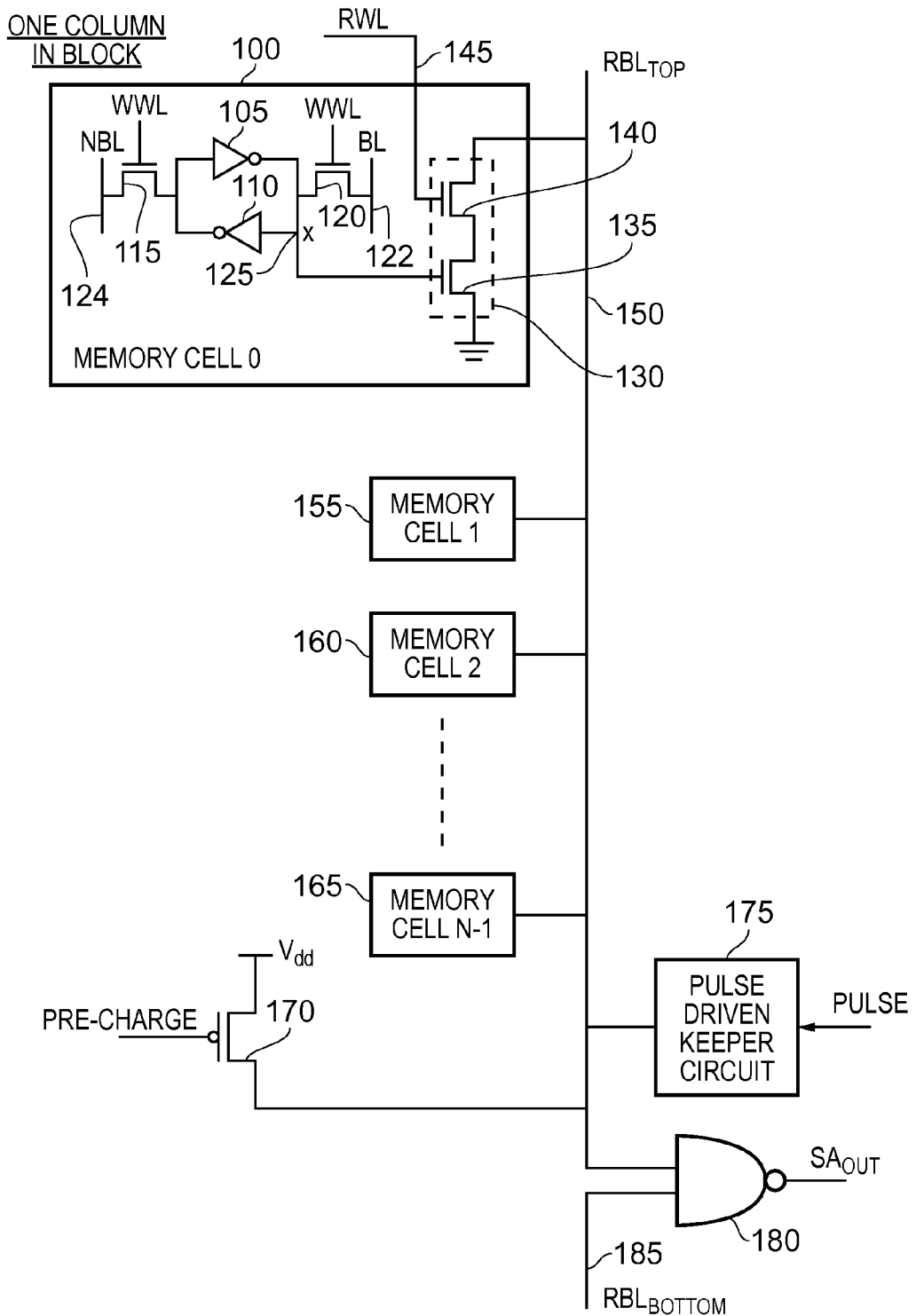
FIG. 2 illustrates components provided in association with one column within a block structure in accordance with the arrangement of FIG. 1A.

FIG. 2 is a diagram illustrating the components provided in association with a single column within the block structure of FIG. 1A in accordance with one embodiment. In particular, the components connected to the top read bit line 150 are illustrated, that read bit line 150 providing one input to the NAND gate 180. The bottom read bit line 185 provides the second input, and will have the same arrangement of components connected to it as are shown in FIG. 2 in respect of the top read bit line 150.

Considering the top read bit line 150, a series of memory cells 100, 155, 160, 165 are connected to the read bit line. Each memory cell has the form shown in detail with respect to the memory cell 100. In particular, the basic memory cell consists of the two NMOS pass gate transistors 115, 120 and the two inverters 105, 110 (formed in the standard way using an arrangement of four transistors), but in addition coupling circuitry 130 consisting of two NMOS transistors 135, 140 is also provided for use during a read operation.

Considering first a write operation directed to the memory cell 100, the write word line (WWL) signal will be asserted to turn on the pass gate transistors 115, 120. Write driver circuitry will then control the voltages on the write bit lines 122, 124 in order to cause the required data value to be written into the memory cell, and at the end of the write operation the write word line signal will be de-asserted to turn off the pass gate transistors 115, 120, and hence isolate the data holding part of the cell formed by the inverters 105, 110 from the write bit lines 122, 124. Accordingly, at this point a logic one or a logic zero value will be stored at the node X 125, dependent on the voltages driven on the bit lines 122, 124 during the write operation.

During a read operation, a signal on the read word line 145 will be asserted, turning on the transistor 140 of the coupling circuitry 130. Prior to the read word line signal being asserted, the read bit line 150 will have been precharged to the logic one (Vdd) level using the precharge PMOS transistor 170, and accordingly it can be seen that once the read word line signal is asserted, the read bit line 150 will selectively discharge towards the logic zero level dependent on the value stored at the node X 125 within the memory cell 100. In particular, if the node 125 stores a first value, namely a logic one value, this will turn on the NMOS transistor 135, and cause the bit line 150 to be discharged towards ground. Conversely, if the node 125 stores a logic zero value, the transistor 135 will not be turned on, and the voltage on the bit line should remain at the Vdd level. The sense amplifier 180 will initially have an output at a logic zero level, but as discussed earlier that output will flip to a logic one level during the course of the read operation if the node 125 stores a logic one value and hence the read bit line 150 is discharged.

However, it will be noted that multiple memory cells are coupled to the read bit line 150, each having associated coupling circuitry 130. As device geometries shrink, it has been found that the leakage current through the coupling circuitry has become more significant. In particular, whilst only one of the coupling circuits within the column will have its transistor 140 turned on by an asserted read word line signal, all of the other coupling circuits may contribute to leakage current. The most significant cause of the leakage current is from non-addressed memory cells that store at their node 125 a logic one value. In this situation, although the coupling transistor 140 is turned off, the coupling transistor 135 is turned on, and leakage current through the coupling circuit 130 in that situation will tend to pull the voltage on the read bit line 150 down towards the logic zero level. Some further leakage current also occurs in non-addressed memory cells where the node X 125 stores a logic zero value, and indeed in connection with an addressed memory cell where node X 125 stores a logic zero value (in which case the transistor 140 will be turned on but the transistor 135 will be turned off).

It has been found that as process geometries shrink and the leakage current increases, these effects can potentially give rise to a situation where even though the addressed memory cell stores a logic zero value at its node 125, and accordingly the bit line 150 should remain at the Vdd supply level during the read operation, the leakage current causes the voltage on the bit line to discharge to a significant extent during the period in which the read word line is asserted that the sense amplifier 180 flips its output state to a logic one value, thereby giving an incorrect read value.

In accordance with the embodiment illustrated in FIG. 2, a pulse driven keeper circuit 175 is provided to prevent such a situation arising.

Figure 3A:
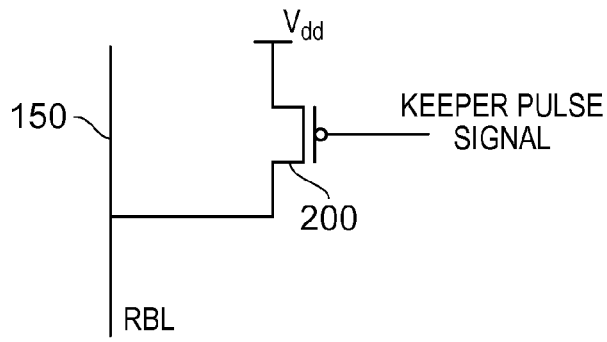
FIG. 3A schematically illustrates the pulse driven keeper circuit that in accordance with embodiments is driven by a keeper pulse signal.

The pulse driven keeper circuit conceptually takes the form illustrated in FIG. 3A, where a transistor 200 is driven by a keeper pulse signal, such that when the keeper pulse signal is asserted, that transistor weakly pulls the voltage on the read bit line back towards the Vdd level. In this example, a PMOS transistor 200 is used, and hence the keeper pulse signal is asserted at a logic zero level and de-asserted at a logic one level.

In accordance with the described embodiments, the keeper pulse signal is delayed with respect to the assertion of the read word line pulse signal, with the amount of the delay being selected such that if the addressed memory cell stores at its node 125 a logic one value, the read bit line 150 will have already discharged to a trip voltage level sufficient to cause the output of the sense amplifier 180 to flip to the logic one value, before the keeper circuit is activated. As a result, the operation of the keeper circuit has no detrimental effect on the performance of the read operation. However, in addition, the timing of the assertion of the keeper pulse signal is chosen so that it is asserted prior to a time at which leakage current through the various coupling circuits of the memory cells connected to the read bit line 150 could have caused the voltage on the read bit line 150 to discharge to that trip voltage level, hence avoiding the possibility of an incorrect sensing of the data value by the sense amp 180.

Figure 3B:
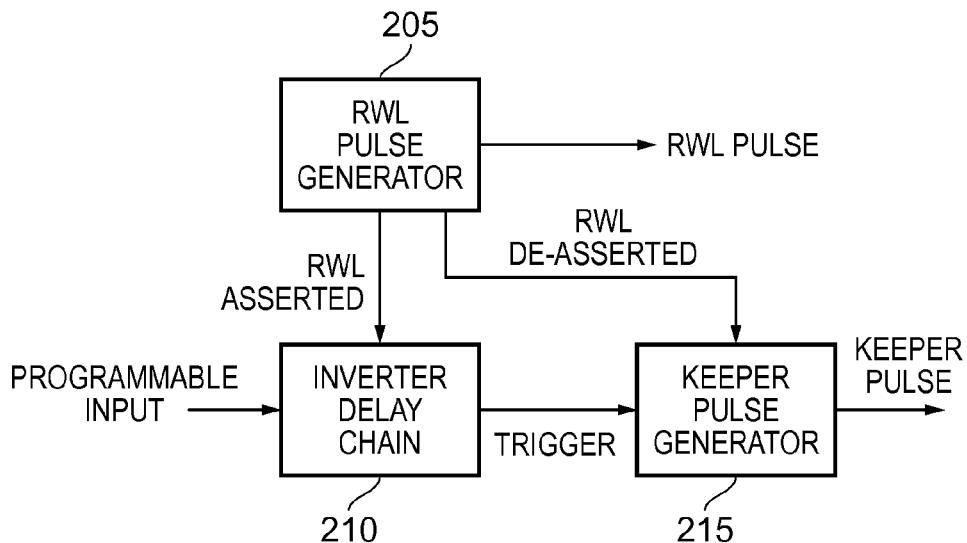
FIG. 3B illustrates components that may be provided to enable the keeper pulse signal to be derived from the read word line pulse signal in accordance with one embodiment.
Figure 3C:
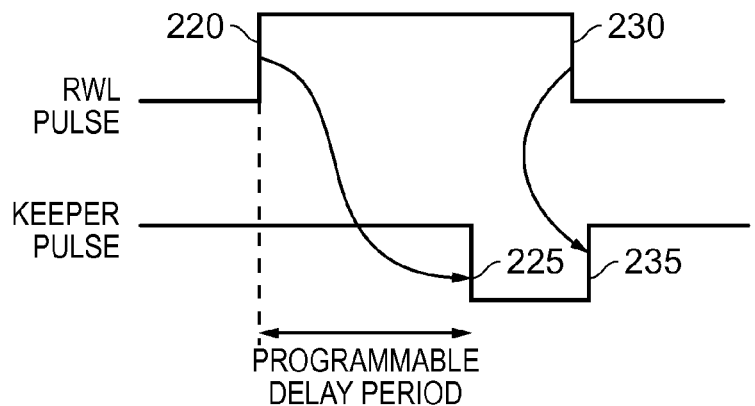
FIG. 3C is a timing diagram illustrating how the keeper pulse signal is derived from the read word line pulse signal.

FIG. 3B schematically illustrates how the keeper pulse signal can be generated in one embodiment. As shown, a read word line pulse generator 205 is arranged to activate the read word line pulse at the start of a read operation. When the read word line pulse is asserted, a signal is issued to an inverter delay chain 210 which then issues a trigger to the keeper pulse generator 215 after some delay encoded by the inverter delay chain 210. Once the trigger is received by the keeper pulse generator 215, it then asserts the keeper pulse signal. Subsequently, when the read word line is de-asserted by the read word line pulse generator 205, a signal is issued to the keeper pulse generator 215, causing the keeper pulse generator to de-assert the keeper pulse signal. As a result, the relationship between the read word line pulse signal and the keeper pulse signal is as shown schematically in FIG. 3C. In particular, following assertion of the read word line pulse at point 220, a delay is introduced by the inverter delay chain 210 whereafter the keeper pulse signal is asserted at point 225. Once the read word line pulse is de-asserted at point 230, the keeper pulse signal is then de-asserted at point 235.

In accordance with one embodiment, the delay period between assertion of the read word line pulse at point 220 and assertion of the keeper pulse at point 225 is programmable so as to allow the amount of delay to be tuned as desired in order to ensure that the speed of the read operation is not affected by assertion of the keeper pulse but that the keeper pulse is asserted sufficiently early enough to ensure that there is no possibility of a miss-read by the sense amp 180. This programmability is illustrated in more detail with reference to the timing diagram of FIG. 4.

Figure 4:
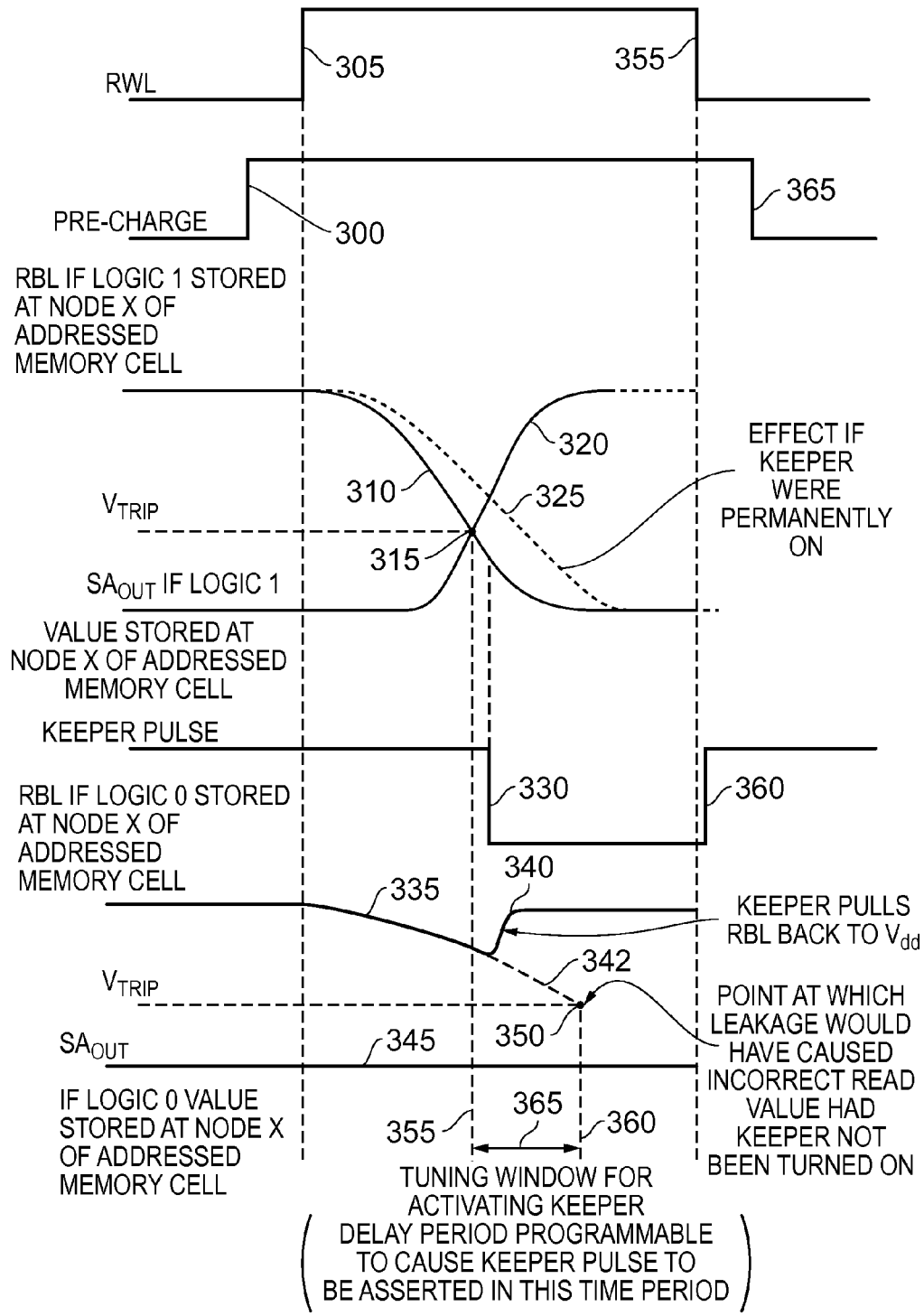
FIG. 4 is a more detailed timing diagram illustrating the values of various signals during the performance of a read operation in accordance with one embodiment.

As shown in FIG. 4, at point 300, the precharge signal is de-asserted to turn off the precharge phase, at which point the read bit line will have been precharged up to the logic one voltage level, and shortly thereafter the read word line signal is asserted at point 305 to turn on the coupling transistor 140 in each addressed memory cell (there being only one addressed memory cell in any particular column). If node 125 of an addressed memory cell stores a logic one value, then the voltage on the associated read bit line will start to discharge towards the logic zero level as shown by the curve 310. At some point, the voltage level will drop to a trip voltage level 315 which causes the sense amp output to transition from the logic zero to the logic one level, as indicated by the curve 320. If the pulse driven keeper circuit 175 had been turned on for the duration of this period, it would have tended to pull the voltage back towards the logic one level, hence slowing the discharge operation down, and causing the voltage on the bit line to instead follow the path shown by the dotted line 325. This would have impacted the speed of the read operation.

However, in accordance with the described embodiment, the keeper pulse signal is de-asserted until at least after the trip voltage point 315 is reached, and accordingly has no effect on the speed of the read operation.

At some time after the voltage on the read bit line would have discharged to the trip voltage level 315 if the node X 125 of the addressed memory cell stored a logic one value, the keeper pulse signal is asserted at point 330. This has no effect if the node X 125 of the addressed memory cell did in fact store a logic one value, but if that node instead stored a logic zero value, then it does have an effect. In particular, the slope 335 shows the effect of leakage current on the voltage on the read bit line in the situation that the addressed memory cell stores a logic zero value at its node X 125. As soon as the keeper pulse is asserted, then the keeper circuit 175 reverses the effect of the leakage current, and pulls the voltage back up to the Vdd level, as shown by the curve 340. This prevents the possibility of incorrect read operation that could have occurred had the keeper circuit not been asserted. In particular, as shown by the dotted line 342, if the keeper circuit had not been asserted, then it is possible that the leakage current would, at some point during the period in which the read word line is asserted, have caused the voltage on the read bit line to drop to the trip voltage level (as indicated by the point 350), and at that point the sense amp output would have flipped to the logic one value. Instead, due to the operation of the keeper circuit, it can be seen that the sense amp output 345 remains at the logic zero level for the duration of the read operation in the event that a logic zero value is stored at node X.

As shown in FIG. 4, the window of time 365 between the times 355 and 360 provide a tuning window during which activation of the keeper pulse can take place by programming of an appropriate delay period to be introduced by the inverter delay chain 210.

The programming of the delay period can take place at a variety of stages. For example, in situations where the instance of the memory device is designed using a memory compiler that generates that instance from a memory architecture associated with the memory compiler, the programming of the delay period can be performed at memory compile time to take account of features specific to the particular instance generated. For example, the number of memory cells connected to the read bit line 160 will vary dependent on the instance created, and the more memory cells that are coupled to the read bit line, the greater the source of leakage current. Similarly, the more memory cells connected to a particular row, the higher the load on the read word line, and the slower the transition of the word line from the de-asserted to the asserted state. These factors will all influence the form of the slope 310 and indeed the slope 335, and hence will affect the timing of points 355, 360 defining the tuning window 365.

Further, post manufacture, the delay period can be programmable in use so as to take account of variations in operating parameters of the memory device. For example, it may be the case that the memory device is able to be operated at a variety of different voltage levels, such as when the memory device is included within a data processing system employing dynamic voltage scaling techniques. When operating at different voltages, this will affect both the steepness of the slope 310 and also the steepness of the leakage current slope 335, and hence the appropriate delay for each possible operating voltage can be programmed so as to ensure that the keeper pulse continues to be asserted between the points 355 and 360 for all possible operating voltages.

Figure 5:
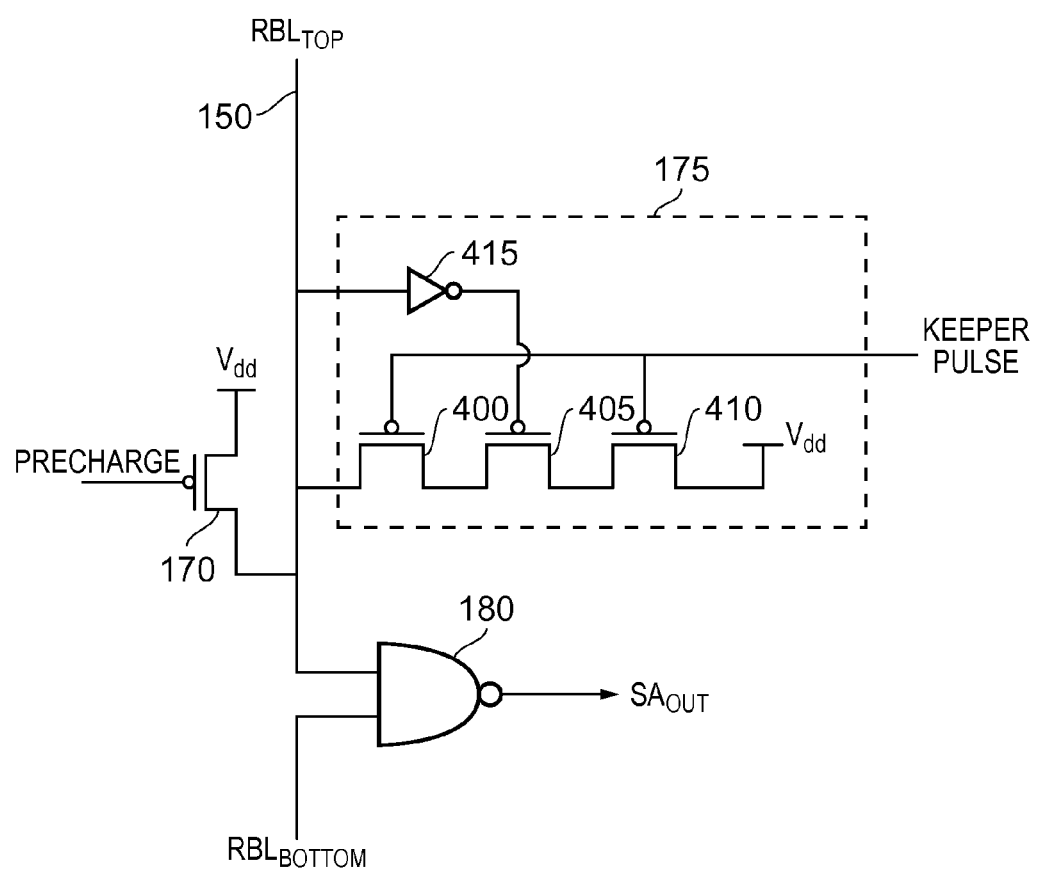
FIG. 5 is a diagram illustrating in more detail the pulse driven keeper circuitry in accordance with one embodiment.

FIG. 5 illustrates one example configuration of the pulse driven keeper circuit 175 of FIG. 2. As shown, in this example the keeper circuit 175 comprises a series of transistors 400, 405, 410 connected in series between a supply voltage Vdd and the read bit line 150. By providing a plurality of transistors in series, this reduces the strength of the keeper circuit, and ensures that it only weakly pulls the voltage towards the supply voltage level Vdd. Hence, the keeper circuit will not have the strength to reverse the positive discharge effect of a logic one value being stored at node X of the addressed memory cell when it is turned on in the latter part of the asserted read word line pulse. However, its strength will be sufficient to reverse the effect of the leakage current.

In one embodiment, all of the transistors 400, 405, 410 are PMOS transistors, and accordingly the keeper pulse signal is asserted at a logic zero level. Whilst all of these PMOS transistors could be connected to the keeper pulse signal, in the embodiment shown in FIG. 5 the middle transistor 405 is connected to the output of inverter 415, whose input is connected to the read bit line 150. By such an approach, this means that when the addressed memory cell stores a logic one value at its node X 125, and accordingly the read bit line is discharged towards the logic zero level during the read operation, then by the time the keeper pulse signal is asserted, the output of the inverter 415 has switched from a logic zero to a logic one level, hence turning the PMOS transistor 405 off (and thus turning the keeper circuit 175 off). This saves power consumption in that situation, by avoiding the keeper circuit being turned on when it is not needed. However, in the alternative situation where the node X of the addressed memory cell stores a logic zero value, and accordingly only leakage current is contributing to the discharge of the voltage on the read bit line 150, then by the time the keeper pulse signal is asserted, the output of the inverter 415 will still be at a logic zero level, and accordingly the keeper pulse circuit will be turned on, causing the read bit line 150 to be pulled back to the logic one voltage level.

Figure 6:
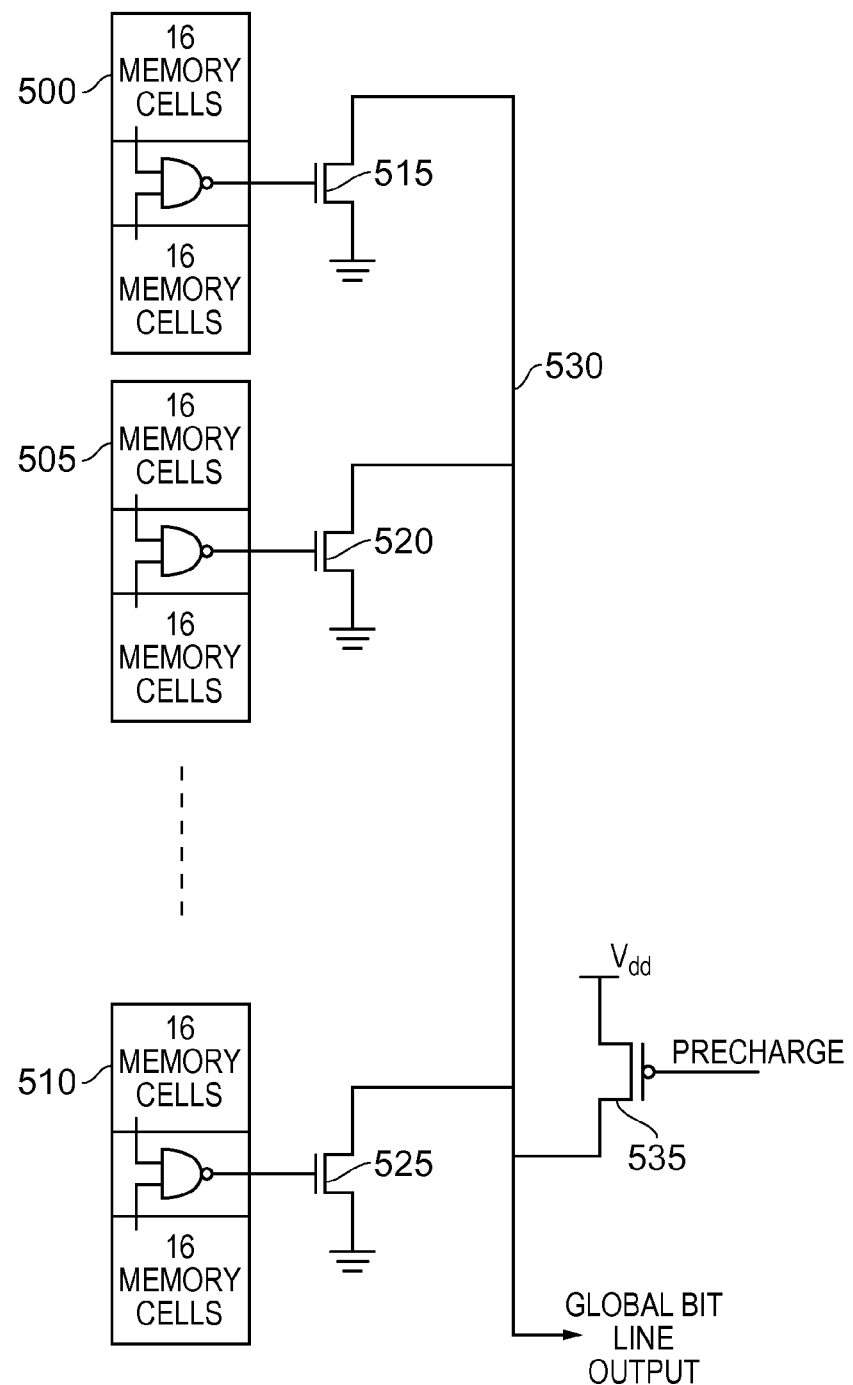
FIG. 6 illustrates how a plurality of block structures in accordance with FIG. 1A may be coupled to form a column of the memory array with an associated global read bit line.

FIG. 6 shows an arrangement where multiple of the block structures of FIG. 1A are arranged to form a column of the memory array. FIG. 6 shows one such column, where the top memory cell region and bottom memory cell region of each block contains 16 memory cells within their column group. The output from each sense amp is provided as an input to a corresponding NMOS transistor 515, 520, 525, and accordingly it will be seen that if any of the blocks 500, 505, 510 include an addressed memory cell that stores a logic one value at its node X 125, then the sense amp output will transition to a logic one level during the read operation and hence turn on the corresponding NMOS transistor. However, only one of those transistors will be turned on, since for any particular read operation, there will only be one addressed memory cell within a particular column. Hence, the global bit line 530, which is precharged by the precharge circuitry 535 to a logic one level prior to the start of the read operation, will be discharged towards a logic zero level if the addressed memory cell stores a logic one value at its node X 125. Otherwise, the global bit line output will remain at a logic one level. The voltage on the global bit line 530 can then be sensed by an appropriate global sense amplifier structure (not shown), for example an inverter.

Figure 7:
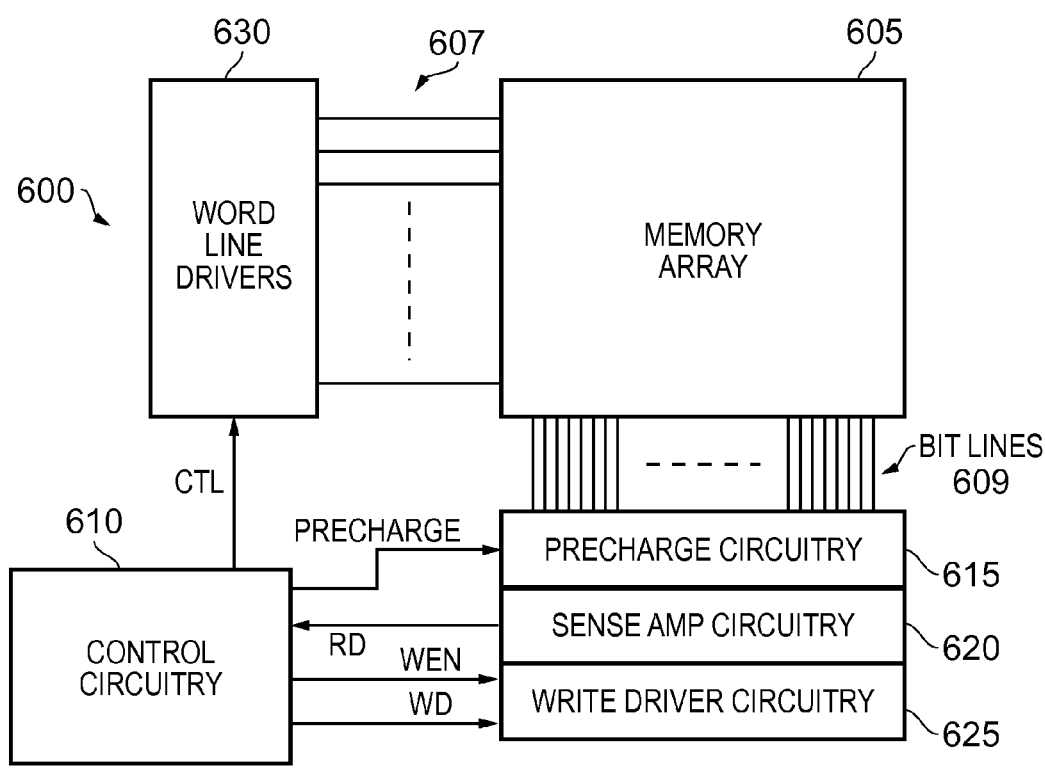
FIG. 7 is a block diagram schematically illustrating the logical arrangement of a memory device in accordance with one embodiment.

FIG. 7 is a diagram schematically illustrating a logical arrangement of a memory device in accordance with one embodiment. In particular, the memory device 600 includes a memory array 605 comprising an array of memory cells arranged in a plurality of rows and columns. A plurality of word lines 607 (including the earlier-described write word lines and read word lines) are provided through the array in order to allow individual rows of memory cells to be addressed by the word line drivers 630 during write and read operations. In addition, a plurality of bit lines 609 (including the write bit line pairs, and the read bit lines referred to earlier) are provided in association with the columns of memory cells. Each column is coupled to the relevant write and read bit lines to enable data to be written into an activated memory cell of the column during a write operation, and for data to be read from an activated memory cell of the column during a read operation.

Precharge circuitry 615 is used to precharge the voltage level on the bit lines under the control of control circuitry 610. Following the precharge operation, a write operation or read operation can be performed. For a write operation, the control circuitry 610 will issue a control signal to the word line drivers 630 in order to cause a particular row of memory cells to be activated via the associated write word line, and the control circuitry 610 will further cause the write driver circuitry 625 to control the voltages on the relevant write bit line pairs, in order to cause the required data values to be written into the memory cells of the activated row. For a read operation, again the control circuitry 610 will issue a control signal to the word line drivers 630 in order to cause a particular row of memory cells to be activated via the appropriate read word line, and the sense amplifier circuitry 620 will then be used in order to evaluate the voltages on the relevant read bit lines, with the sensed read data then being returned to the control circuitry 610.

Whilst FIG. 7 is intended to logically illustrate the arrangement of the memory device, it will be appreciated that it is not intended to provide an indication of the structural arrangement. For example, as will be apparent from the earlier discussion, the sense amplifier circuitry 620 is actually embedded within blocks forming the memory array, as is the precharge circuitry.

Figure 8:
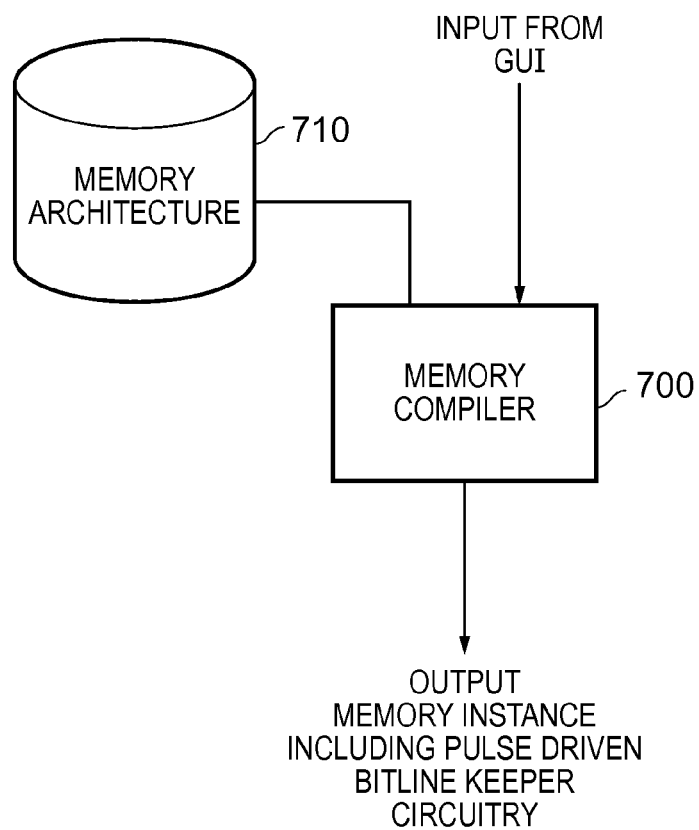
FIG. 8 is a diagram schematically illustrating the operation of a memory compiler to generate a memory instance including pulse driven keeper circuitry of the described embodiments.

FIG. 8 schematically illustrates how a memory instance including pulse driven bit line keeper circuitry in accordance with the above described embodiments may be created from a memory compiler 700 with reference to a memory architecture 710. The memory architecture 710 specifies a definition of circuit elements and data defining rules for combining those circuit elements in order to create a memory instance. Particular requirements for the memory instance are entered into the memory compiler 700 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc.

The memory compiler 700 then generates the required memory instance based on the input parameters and the memory architecture 710. In accordance with one embodiment, the memory compiler includes, in association with the read bit line of each column group, pulse driven keeper circuitry to be activated by a keeper pulse signal in the manner described with reference to the earlier figures. Further, taking account of the input parameters specified via the GUI, the compiler programs into the memory instance an appropriate delay period defining the time that will elapse following assertion of a read word line pulse signal before the keeper pulse signal is then asserted.

Figure 9:
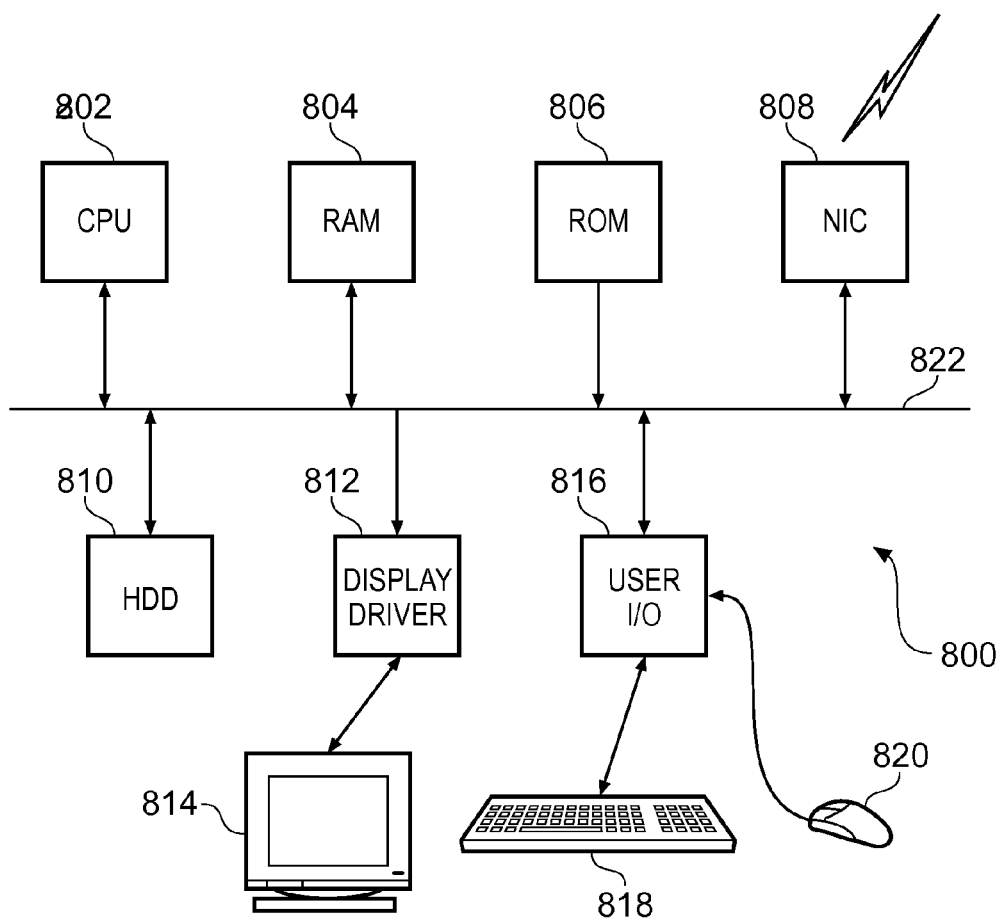
FIG. 9 is a diagram of a computer system on which a memory compiler operation may be performed to generate a memory instance conforming to the above described embodiments.

FIG. 9 schematically illustrates a general purpose computer 800 of the type that may be used to implement the above described memory compilation operation in order to generate a memory instance. The general purpose computer 800 includes a central processing unit 802, a random access memory 804, a read only memory 806, a network interface card 808, a hard disk drive 810, a display driver 812 and monitor 814 and a user input/output circuit 816 with a keyboard 818 and mouse 820 all connected via a common bus 822. In operation the central processing unit 802 will execute computer program instructions that may be stored in one or more of the random access memory 804, the read only memory 806 and the hard disk drive 810 or dynamically downloaded via the network interface card 808. The results of the processing performed may be displayed to a user via the display driver 812 and the monitor 814. User inputs for controlling the operation of the general purpose computer 800 may be received via the user input output circuit 816 from the keyboard 818 or the mouse 820 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 800. When operating under control of an appropriate computer program, the general purpose computer 800 can perform the above described memory compiler operation and can be considered to form an apparatus for performing the above described memory compiler operation. The architecture of the general purpose computer 800 could vary considerably and FIG. 9 is only one example.

From the above described embodiments, it will be seen that a simple mechanism is provided for preventing leakage current causing an incorrect evaluation of the data stored in an addressed memory cell, without impacting the performance of the read operation. The circuitry required to implement this feature involves only a few gates, and therefore has a minimal impact on area of the memory device. Further, the technique can be tuned to take account of different configurations of memory device, and also to accommodate variations in operating parameters during operation of the memory device. Considering the example of operating voltage, as the operating voltage is decreased, the time at which the keeper circuit is turned on can be further delayed, or indeed the keeper circuit could even be turned off at some low operating voltages where the leakage current effect will be insufficient to pull the voltage on the bit line down to the trip voltage level during the period of the asserted read word line signal.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. A memory device comprising:
   an array of memory cells arranged as a plurality of rows and columns, each row of memory cells being coupled to an associated read word line, each column of memory cells forming at least one column group, and the memory cells of each column group being coupled to an associated read bit line;
   word line driver circuitry configured, during a read operation, to issue an asserted read word line pulse signal on the read word line coupled to an addressed row of the array so as to activate the memory cells within that addressed row whilst the read word line pulse signal is asserted;
   precharge circuitry configured, prior to the read operation, to precharge each read bit line to a first voltage level;
   during the read operation the voltage on the read bit line associated with any column group containing one of the activated memory cells being arranged to transition towards a second voltage level if a data value stored in that activated memory cell has a first value;
   sense amplifier circuitry connected to the associated read bit line of each column group, and configured for each activated memory cell to determine that that activated memory cell stores said first value if the voltage on the associated read bit line transitions to a trip voltage level between said first and said second voltage levels whilst the read word line pulse signal is asserted, and to determine that that activated memory cell stores a second value if the voltage on the associated read bit line does not transition to said trip voltage level whilst the read word line pulse signal is asserted;
   bit line keeper circuitry coupled to each read bit line and responsive to an asserted keeper pulse signal to pull the voltage on each read bit line towards the first voltage level; and
   keeper pulse signal generation circuitry configured to assert the keeper pulse signal at a selected time after the read word line pulse signal is asserted, the selected time being selected such that if an activated memory cell stores said first value, the voltage on the associated read bit line will have transitioned to the trip voltage level before the keeper pulse signal is asserted, and such that if an activated memory cell stores said second value, leakage current within the memory cells of the column group coupled to the associated read bit line will not have caused the voltage on the associated read bit line to have transitioned to the trip voltage level before the keeper pulse signal is asserted.

2. A memory device as claimed in claim 1, further comprising delay circuitry configured to be responsive to the word line driver circuitry asserting the read word line pulse signal to generate a trigger signal to the keeper pulse signal generation circuitry after a selected delay period, the keeper pulse signal generation circuitry being responsive to the trigger signal to assert the keeper pulse signal.

3. A memory device as claimed in claim 2, wherein the selected delay period is programmable.

4. A memory device as claimed in claim 3, wherein the selected delay period is programmable at memory compiler time to take account of the configuration of the memory cells within the array.

5. A memory device as claimed in claim 3, wherein the selected delay period is programmable such that the selected delay period can be altered during operation of the memory device to take account of one or more changes in operating parameters of the memory device.

6. A memory device as claimed in claim 1, wherein the keeper pulse signal generation circuitry is responsive to de-assertion of the read word line pulse signal to de-assert the keeper pulse signal.

7. A memory device as claimed in claim 1, wherein the bit line keeper circuitry comprises, for each read bit line, a plurality of transistors connected in series between that read bit line and a terminal at the first voltage level, a gate terminal of at least one of said transistors being driven by the keeper pulse signal.

8. A memory device as claimed in claim 7, wherein said plurality of transistors are PMOS transistors, and said keeper pulse signal is asserted at a logic zero level and de-asserted at a logic one level.

9. A memory device as claimed in claim 8, wherein the bit line keeper circuitry further comprises, for each read bit line, an inverter connected between that read bit line and a gate terminal of at least one of said transistors.

10. A memory device as claimed in claim 9, wherein a first transistor and a last transistor in said plurality have their gate terminals driven by the keeper pulse signal and at least one transistor between the first transistor and the last transistor has its gate terminal connected to an output of the inverter.

11. A memory device as claimed in claim 1, wherein each memory cell comprises coupling circuitry connected between the associated read bit line and a terminal at said second voltage level, during a read operation the coupling circuitry of the memory cells within each column group contributing towards a leakage current that draws the voltage level on the associated read bit line towards said second voltage level.

12. A memory device as claimed in claim 11, wherein the coupling circuitry of each memory cell comprises a plurality of coupling transistors arranged in series between the associated read bit line and said terminal at said second voltage level, a gate terminal of at least one of the coupling transistors being connected to the read word line pulse signal and a gate terminal of at least one other of the coupling transistors being connected to an internal storage node of the memory cell.

13. A memory device as claimed in claim 1, wherein the first voltage level is a supply voltage level and the second voltage level is a ground voltage level.

14. A memory device as claimed in claim 1, wherein each column of memory cells forms a plurality of column groups.

15. A memory device as claimed in claim 14, wherein the plurality of column groups form multiple pairs of column groups, and the sense amplifier circuitry comprises a sense amplifier element associated with each pair of column groups, the sense amplifier element being connected to the read bit lines of both column groups in the associated pair.

16. A memory device as claimed in claim 15, wherein the sense amplifier element comprises a NAND gate structure.

17. A method of performing a read operation within a memory device having an array of memory cells arranged as a plurality of rows and columns, each row of memory cells being coupled to an associated read word line, each column of memory cells forming at least one column group, and the memory cells of each column group being coupled to an associated read bit line, the method comprising:
   prior to the read operation, precharging each read bit line to a first voltage level;
   during the read operation, issuing an asserted read word line pulse signal on the read word line coupled to an addressed row of the array so as to activate the memory cells within that addressed row whilst the read word line pulse signal is asserted, during the read operation the voltage on the read bit line associated with any column group containing one of the activated memory cells being arranged to transition towards a second voltage level if a data value stored in that activated memory cell has a first value;
   using sense amplifier circuitry connected to the associated read bit line of each column group to determine, for each activated memory cell, that that activated memory cell stores said first value if the voltage on the associated read bit line transitions to a trip voltage level between said first and said second voltage levels whilst the read word line pulse signal is asserted, and to determine that that activated memory cell stores a second value if the voltage on the associated read bit line does not transition to said trip voltage level whilst the read word line pulse signal is asserted;
   responsive to an asserted keeper pulse signal, using bit line keeper circuitry coupled to each read bit line to pull the voltage on each read bit line towards the first voltage level; and
   asserting the keeper pulse signal at a selected time after the read word line pulse signal is asserted, the selected time being selected such that if an activated memory cell stores said first value, the voltage on the associated read bit line will have transitioned to the trip voltage level before the keeper pulse signal is asserted, and such that if an activated memory cell stores said second value, leakage current within the memory cells of the column group coupled to the associated read bit line will not have caused the voltage on the associated read bit line to have transitioned to the trip voltage level before the keeper pulse signal is asserted.

18. A memory device comprising:
   an array of memory cell means arranged as a plurality of rows and columns, each row of memory cell means for coupling to an associated read word line, each column of memory cell means for forming at least one column group, and the memory cell means of each column group for coupling to an associated read bit line;

word line driver means for issuing, during a read operation, an asserted read word line pulse signal on the read word line coupled to an addressed row of the array so as to activate the memory cell means within that addressed row whilst the read word line pulse signal is asserted;

precharge means for precharging, prior to the read operation, each read bit line to a first voltage level;

during the read operation the voltage on the read bit line associated with any column group containing one of the activated memory cell means being arranged to transition towards a second voltage level if a data value stored in that activated memory cell means has a first value;

sense amplifier means for connecting to the associated read bit line of each column group, and for determining, for each activated memory cell means, that that activated memory cell means stores said first value if the voltage on the associated read bit line transitions to a trip voltage level between said first and said second voltage levels whilst the read word line pulse signal is asserted, and for determining that that activated memory cell means stores a second value if the voltage on the associated read bit line does not transition to said trip voltage level whilst the read word line pulse signal is asserted;

bit line keeper means for coupling to each read bit line and, responsive to an asserted keeper pulse signal, for pulling the voltage on each read bit line towards the first voltage level; and keeper pulse signal generation means for asserting the keeper pulse signal at a selected time after the read word line pulse signal is asserted, the selected time being selected such that if an activated memory cell means stores said first value, the voltage on the associated read bit line will have transitioned to the trip voltage level before the keeper pulse signal is asserted, and such that if an activated memory cell means stores said second value, leakage current within the memory cell means of the column group coupled to the associated read bit line will not have caused the voltage on the associated read bit line to have transitioned to the trip voltage level before the keeper pulse signal is asserted.

19. A computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device as claimed in claim 1.

* * * * *